(12) United States Patent
Kitchin

(10) Patent No.: US 7,057,182 B2
(45) Date of Patent: Jun. 6, 2006

(54) METHOD AND SYSTEM FOR DETERMINING DISTORTION IN A CIRCUIT IMAGE

(75) Inventor: John F. Kitchin, Shrewsbury, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 60 days.

(21) Appl. No.: 10/799,170

(22) Filed: Mar. 12, 2004

(65) Prior Publication Data

US 2005/0209827 A1   Sep. 22, 2005

(51) Int. Cl.
*G01T 1/24* (2006.01)
*G01T 1/20* (2006.01)

(52) U.S. Cl. .................. 250/370.11; 250/339.06; 716/4

(58) Field of Classification Search ........... 250/370.11, 250/339.06; 716/4
See application file for complete search history.

(56) References Cited

U.S. PATENT DOCUMENTS

| | | | |
|---|---|---|---|
| 5,023,916 A * | 6/1991 | Breu ...................... | 382/150 |
| 6,392,235 B1 * | 5/2002 | Barrett et al. .......... | 250/363.06 |
| 6,839,656 B1 * | 1/2005 | Ackermann et al. ...... | 705/36 R |
| 6,891,363 B1 * | 5/2005 | Desplats et al. ........ | 324/158.1 |
| 2003/0026477 A1 * | 2/2003 | Ishiga ..................... | 382/166 |
| 2003/0078503 A1 * | 4/2003 | Tsuchiya ................ | 600/476 |

OTHER PUBLICATIONS

J. C. Tang, et al.; "Picosecond imaging circuit analysis," IBM J. Res. Develop. vol. 44, No. 4, Jul. 2002, pp. 583-603.
C. Bolt; "Photoemission Microscopy-Advanced/Theory of Operation," Infineon Semiconductors, pp. 213-223.

* cited by examiner

Primary Examiner—Marc S. Hoff
Assistant Examiner—Janet L Robbins

(57) ABSTRACT

Embodiments of the invention may reduce timing and spatial distortion in Picosecond Imaging and Circuit Analysis (PICA). In one embodiment, a method of determining distortion in a circuit image comprises: defining potential photon emission areas in the circuit image using a layout database, determining ideal photon emissions over the potential photon emission areas, measuring photon emissions for the potential photon emission areas, comparing the ideal photon emission with the measured photon emissions, and producing a mathematical model that predicts the amount of spatial distortion over the potential photon emission area.

24 Claims, 5 Drawing Sheets

600

```
LaplaceCDFdiff = Compile[{a,b,∆}, Module[
(* Computes F[b,∆] - F[a,∆] where F is the Laplace CDF *)
(* John Kitchin, HP *)
(* Underlying Laplace PDF is Exp[-Abs[t]]/2 , so scale factor = 1 *)
(* Underlying Uniform is Uniform on [-∆,∆] *)
(*     so ∆ is in units of the Scale Factor *)
{r = e^a,
 s = e^b,
 t = e^∆,
 q},
 u = t^2;
 q = 4∆t;
```

If[b<-∆, If[a<-∆, (s-r) (-1+t$^2$),

If[a<∆, $-s-\frac{1}{r}+r+st^2-2t(a+∆)$, $\frac{-1-sr+t^2+srt^2-4rt∆}{r}$ ]],

If[b<∆, If[a<-∆, $\frac{1}{s}-s+r-rt^2+2t(b+∆)$, If[a<∆, $\frac{1}{s}-s-\frac{1}{r}+r+2(b-a)$ $\frac{-1+\frac{r}{s}-sr+t^2-2rt(∆-b)}{r}$ ]], If[a<-∆, $\frac{1}{s}+r-\frac{t^2}{s}-rt^2+4t∆$, If[a<∆, $\frac{1}{s}-\frac{1}{r}+r-\frac{t^2}{s}+2t(∆-a)$, $\frac{(s-r)(-1+r^2)}{sr}$ ]]]/q

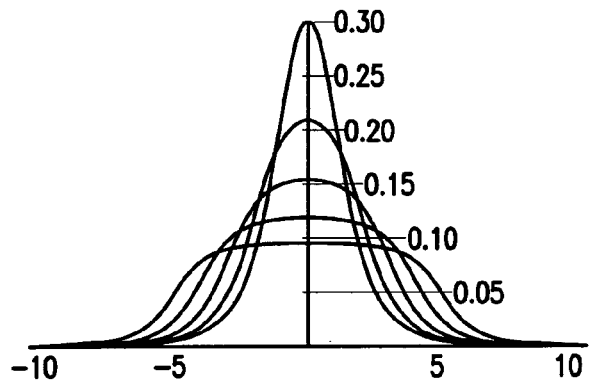

Figure 4B

METHOD AND SYSTEM FOR DETERMINING DISTORTION IN A CIRCUIT IMAGE

BACKGROUND

Integrated circuits (ICs) are ubiquitous in today's society. ICs have microscopic dimensions, which may make ICs difficult to test and characterize. Recent techniques for measuring IC parameters include Picosecond Imaging Circuit Analysis (PICA). In general, PICA techniques provide a measure of the relative timing and source position of infrared light or photon emissions that occur at various locations across an IC at various times. The PICA technique relies on current-carrying transistors emitting infrared light as the transistors switch states. Because current flow is indicative of a switching transition, and because infrared light emission is indicative of current flow, photon detection may be used to measure the timing of switching events in digital circuits.

However, accurately extracting spatial-related and timing-related parameters from PICA measurements is not a straightforward procedure. Photon emission is a statistical process, and the probability of detected photon emission for current very large scale integration (VLSI) technology is on the order of $10^{-9}$ infrared photons per switching event per micron of transistor channel width. To acquire a statistically useful measurement, many switching events must be generated, and the timing of the separately detected photons must be correlated with a repeatable trigger. The relative timing of the photons can be plotted as a histogram, and the peak of the histogram may be used to determine the timing of the transistor's switching transition relative to the trigger. Unfortunately, the histograms are "noisy" as a result of the granularity of the events (i.e., either a photon is detected, or not detected) and the rarity of events. The noise makes the measurements difficult to interpret. The histograms gradually approach a smooth curve if the measurements are taken over a sufficiently long period of time, but this is feasible for small width devices or devices that switch infrequently relative to the clock frequency. Furthermore, as device sizes continue to decrease, histograms representing spatial photon emission will tend to become less precise.

SUMMARY

An objective method of extracting spatial and timing related circuit parameters from picosecond-scale photon timing measurements is desirable. In accordance with at least some embodiments, a method of determining distortion in a circuit image comprises: defining potential photon emission areas in the circuit image using a layout database, determining ideal photon emissions over the potential photon emission areas, measuring photon emissions for the potential photon emission areas, comparing the ideal photon emission with the measured photon emissions, and producing a mathematical model that predicts the amount of spatial distortion over the potential photon emission area.

BRIEF DESCRIPTION OF THE DRAWINGS

A better understanding of the present invention can be obtained when the following detailed description is considered in conjunction with the following drawings, in which:

FIG. 4A shows an algorithm for developing a model of spatial distortion;

FIG. 4B shows several Laplace based distributions with varying scale factors;

DETAILED DESCRIPTION

Figure 1:
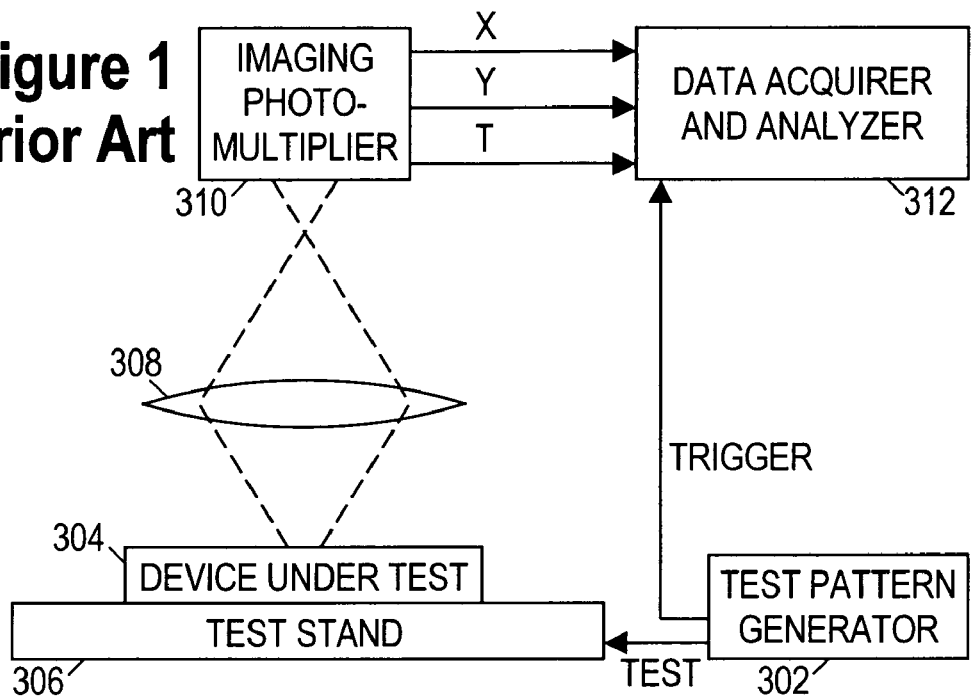
FIG. 1 shows an exemplary picosecond-scale photon detection system.

FIG. 1 shows an illustrative functional block diagram of an apparatus for making picosecond-scale photon timing measurements. The apparatus includes a test pattern generator 302 that generates a sequence of input signal vectors, or "test vectors," that are designed to make a device under test 304 (e.g., an IC) operate in a desired manner. The desired operation depends on various circumstances. For example, when a fault has been detected in the device 304 under certain operating conditions, the test pattern generator is programmed to duplicate those operating conditions. When measuring propagation delay between circuit components, the test vectors may be designed to repeatedly cause transitions in those components.

The test pattern generator 302 provides the test vectors to the device under test 304, which is supported in a test stand 306. The test stand 306 accepts input signals from the test pattern generator 302 and provides the input signals to the device under test 304 along with power and any other needed signals (e.g., clock signals, bias voltages, etc.) The test stand 306 also may accept output signals from device 304 and provide the output signals to another functional block (not shown).

Device under test 304 can be a fully packaged IC chip that has been modified to make the back side of the chip's silicon substrate viewable. In addition the substrate may be thinned to increase the transparency of the substrate to infrared light.

As the device 304 operates, currents flow through various components within the device, and in particular, through metal-oxide-semiconductor field effect transistors (MOSFETs) undergoing switching transitions. The current-carrying components emit photons of infrared light that pass through the substrate and radiate from the back side. A microscope lens 308 captures and redirects the photons into an imaging photomultiplier 310.

Photomultiplier 310 performs at least two functions: amplification and measurement. A single photon impacting on the photomultiplier 310 knocks an electron free from an image grid contained in the photomultiplier. The photomultiplier 310 amplifies the effect of the freed electron to create a cascade of electrons that form a detectable current pulse. The photomultiplier 310 also measures the position of the incident photon in an image grid by determining where the current pulse was detected. The image grid may be divided into a suitable number (e.g., 512 or more) of rows and columns. Photomultiplier 310 provides an X signal indicating the row, and a Y signal indicating the column in which the photon is detected. In addition, the transient current pulse is conditioned to form a "T" signal that indicates the time when the photon is detected. The T signal provides picosecond-scale resolution. The X, Y, and T signals may or may not be in digital form.

The Data Acquirer and Analyzer (DAA) 312, receives the X, Y, and T signals from the imaging photomultiplier 310 and receives a trigger signal from the test pattern generator 302. Alternatively, the trigger signal may be provided from the device under test 304 or the test stand 306. The trigger signal comprises a reference signal, and typically is correlated with the switching event(s) being measured on device 304. The DAA 312 measures the difference between the T signal relative to the trigger signal to determine photon detection time. If the signals are in a digital format, the DAA 312 calculates a time difference between the T signal and the trigger signal. If the signals are not digital, the DAA 312 determines the photon detection time by measuring an interval between a transition of the trigger signal and a corresponding transition of the T signal.

If the X, Y and T values are not in digital form, the DAA 312 may convert the X, Y, and T values to digital form. The DAA 312 then stores the (X,Y,T) triplets for later analysis. In an alternative embodiment, the DAA 312 constructs a histogram and then, if desired, discards the triplets. The histogram may comprise a three dimensional array of possible (X,Y,T) triplets, in which a count is associated with each of the values. When a particular (X,Y,T) triplet is received, the count associated with that triplet is incremented. The histogram may be stored in the form of a three dimensional array. Alternatively, the histogram may be represented using a more compact data structure—e.g., parallelpipeds as described below.

The data collection performed by the DAA 312 may be divided into sessions. At the beginning of a session, a new data file is created. Creating a new data file may include initializing the histogram with zeros. Data collection then commences and continues until the session is temporarily suspended or is ended. At the end of a session, the data collection is halted and the data file or histogram is exported or stored in long term storage. The data can then be analyzed in a variety of ways by DAA 312 or by an external system.

Figure 2:
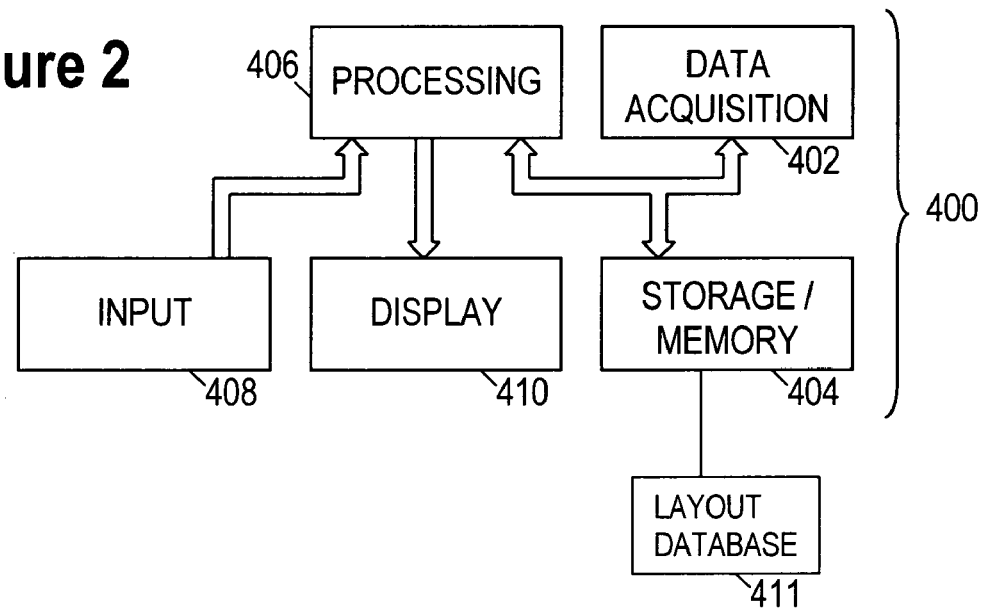
FIG. 2 shows an exemplary functional block diagram of an apparatus for analyzing photon detection data.

FIG. 2 shows an illustrative functional block diagram of a system 400 for analyzing data obtained by the apparatus of FIG. 1. The system 400 may be contained within DAA 312, or alternatively, may be an external system coupled to DAA 312. In yet another embodiment, the system 400 is an entirely separate system to which the data from DAA 312 is transported.

System 400 includes a data acquisition module 402 that receives the photon measurement data. Module 402 may simply be a port through which the data enters the system, or module 402 may be a more complex module for conditioning and acquiring data signals. The data is stored in a storage module 404, which maintains a copy of the data for access by the processing module 406. Storage module may take the form of dynamic random access memory (DRAM), static random access memory (SRAM), Flash ROM (read only memory), optical storage media, magnetic storage media, or any combination thereof. Storage module 404 (or a portion thereof) may be removable so as to be portable between systems. Storage module 404 may further maintain a copy of software for analyzing the data as described further below.

Processing module 406 accepts instructions from a user via input module 408, and responsively operates on the data from storage module 404 to extract circuit timing parameters. The data or parameters may be displayed in some form to the user by display module 410. Storage module 404 may include information regarding the device under test 304, such as a layout database 411 indicating the location of circuit elements on the device under test 304.

Figure 3:
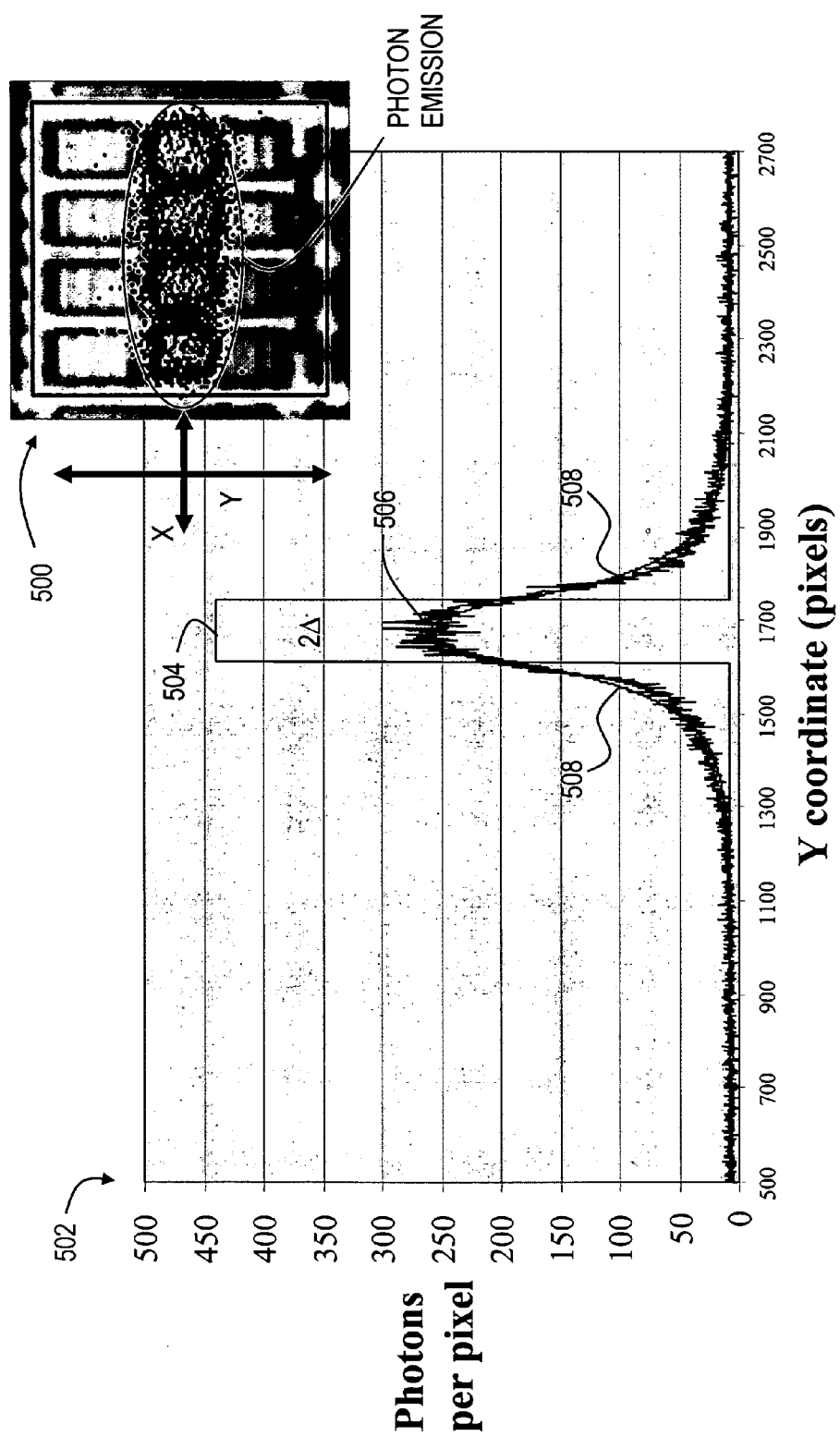
FIG. 3 shows a PICA image of four inverters including spatial distortion.

The photon detection data (or a subset thereof) may be displayed and analyzed in a variety of forms. For example, the user may be interested in evaluating a transistor located at a specific X-Y coordinate during different intervals of time. FIG. 3 depicts an extracted PICA image 500 of four serially connected inverters. The X and Y axes for the PICA image 500 are also shown in FIG. 3. The PICA image 500 indicates photon emission of the inverters over time. The photons generated by each of the inverters often undergo spatial distortion in traveling from the device 304 through the lens 308 and into the photo multiplier 310 so that the actual X-Y location of the photon emission is not accurately portrayed in the PICA image 500 that is extracted.

FIG. 3 depicts this spatial distortion in graph 502 with photon intensity or count from the extracted PICA image 500 on the ordinate axis and the Y pixel location from PICA image 500 on the abscissa axis. For ease of discussion, the X pixel location of each photon counted in the PICA image 500 is held constant at the X axis while the photons are counted at various Y pixel locations over time. Ideal photon emission 504 is indicated by a sharp rectangular pulse, where photons are emitted over an interval having a width of $2\Delta$. (The interval $2\Delta$ is centered at Y pixel location of 1,675 in FIG. 3, but can be scaled to 0 so that the interval may defined as starting at $-\Delta$ and ending at $+\Delta$.) The ideal interval from $-\Delta$ to $\Delta$ corresponds to an area of a saturated transistor where uniform electric field strength is present across the transistor's width, resulting in idealized photon emissions along the area of uniform electric field strength. Measured photon emission 506 is illustrated in FIG. 3 as a bell shaped distribution. The difference between the ideal photon emission 504 and the measured photon emission 506 is referred to as "spatial smear," and may be quantified using various statistical methods. By quantifying the smear or distortion in the extracted data, timing information may be more easily extracted despite distortion.

Based on empirical measurements akin to measurements shown in FIG. 3, the smear in a photon's detection point can be approximated using a Laplace distribution with a probability density function (PDF) that has an exponential-power distribution. Given this PDF, the cumulative distribution function (CDF) may be determined by distorting (e.g., mathematically convolving), the ideal photon emission 504 over the interval from $-\Delta$ to $\Delta$ by the PDF. The coordinates for the interval from $-\Delta$ to $\Delta$ come from the layout database 411. For example, the layout database 411 may define a transistor comprising a gate region where the interval of $-\Delta$ to $\Delta$ corresponds the coordinates of the gate region in the layout database 411. In some embodiments, points along the ideal photon emission 504 may be distorted by mathematically convolving such points with the Laplace distribution along the interval $-\Delta$ to $\Delta$ (from the layout database 411.) The result of such a convolution produces a modified distribution 508 that approximates the measured photon emission 506.

FIG. 4A illustrates an exemplary closed form algorithm 600 for computing the probability that a photon emitted in the interval $-\Delta$ to $\Delta$ is detected in the chosen time interval of (a,b), where the probability is given by the expression $F[b,\Delta]-F[a,\Delta]$. The expression $F[b,\Delta]-F[a,\Delta]$ represents an exemplary closed form expression for the modified distribution 508. Closed form expressions are desirable because closed form expressions often require fewer computation cycles to achieve the desired result. Portions of the device 304 contain large isolated circuit elements with known photon emissions that may be used to calibrate the desired amount of scaling between the modified distribution 508 and the measured photon emission 506. For example, maximum likelihood estimation (MLE) techniques may be used to correlate layout database coordinates to the PICA image of a large isolated circuit element with known photon emission in order to calibrate the desired amount of scaling. The desired scaling factor, which is proportional to the amount of spatial smearing, may be a function of several fundamental factors such as backside wafer preparation, detector lens geometry, and the detector's spatial electrical characteristic.

FIG. 4B illustrates various Laplace based distributions generated by algorithms 600, where each distribution contains a different amount of scaling. Thus, by using information from the layout database 411 to find a statistical model that fits the distortion between the ideal photon emission 504 and the measured photon emission 506, a model for spatial smear may be derived. Although Laplace distributions are described, other embodiments may include different data sets where alternative PDFs are used to produce a model that fits the observed data.

As an aid in making statistical inferences from PICA images, areas of photon emissions may be divided into "emitter" regions that are expressed as a set of pixel coordinates. The layout database 411 defines the possible areas of photon emission that may be divided into emitter regions—e.g., the channel region of CMOS transistors. In general, photon emission is a rare event whose probability is dependent on the electrical state (i.e., electric field intensity and density of charge carriers of the local region). Thus, for each emitter region E, photon emission may be described using a Non-Homogenous Poisson Process (NHPP) $N_E(X,Y,T)$, where the intensity function of the emitter $\lambda_E(X,Y,T)$ is equal to $\lambda_E(T)$ if the photon intensity function is constant over its pixel coordinates but not constant over time. Moreover, the emitter regions in the PICA image can be assumed to be mutually independent processes that interact solely through their intensity functions with respect to time $\lambda_E(T)$. In this manner, when modeling a continuous pixel region whose intensity varies, the pixel region may be divided into separate emitters $E_0$ through $E_N$ with varying intensities $\lambda_0(T)$ though $\lambda_N(T)$, and therefore the accuracy of the general photon intensity function $\lambda(X,Y,T)$ may be modeled to any desired level of accuracy by varying the number of contiguous emitters.

Referring again to FIG. 3, the measured photon emission 506 near the fringes of the abscissa axis (e.g., around Y pixel coordinates 500 and 2700) is non-zero. This non-zero measurement is related to background photon processes and is sometimes referred to as "dark current." Akin to modeling other photon emission, dark current may be modeled using an emitter with a pixel set equal to the entire PICA image coordinates. Furthermore, a collection of emitters may be used to model other background phenomena that cause gradients in photon emission across the PICA image.

In addition to spatial smearing, PICA images undergo timing based distortion as disclosed in commonly owned patent application entitled "Method of Extracting Circuit Timing Parameters Using Picosecond-Scale Photon Timing Measurements," application Ser. No. 10/269,609, filed on Oct. 11, 2002, which is hereby incorporated by reference. The time distortion model developed in previously filed application Ser. No. 10/269,609 may be generalized to be that of an arbitrary mixture of Gaussian distributions scaled to have a mean of zero. Using symbolic representation, if $\phi((s-\mu)/\sigma)/\sigma$ represents the PDF of a Gaussian time distortion model, then Equation 1 represents the PDF of a mean-zero mixture of such models when $\Sigma_{j=1}^{k} b_j = 1$ and $\Sigma_{j=1}^{k} b_j \mu_j = 0$.

$$\psi(s) = \sum_{j=1}^{k} b_j \phi((s-\mu_j)/\sigma_j)/\sigma_j \qquad (1)$$

This general time distortion model is used to model the composite time jitter caused by the photon detector and its timing electronics, even when their time distortion distributions are highly non-Gaussian. The generalization of Equation 1, which uses a mixture of mean-zero approximations, advantageously allows closed form expressions (akin to the NHPP likelihood) that have computational advantages.

The NHPP model previously developed in application Ser. No. 10/269,609 for timing distortion, along with the generalization of Equation 1 may be combined with the spatial distortion model described herein to produce a photon intensity model that accounts for both time and space distortion as given by Equation 2.

$$\overline{\lambda}_E(X,Y,T) = \int_{-\infty}^{\infty} \lambda_E(t-s) \cdot \psi(s) ds \cdot f(x, E_x) \cdot f(y, E_y) \qquad (2)$$

The expression $\lambda_E(t-s)\Psi(s)$ represents the time distortion model (developed in previously filed application Ser. No. 10/269,609) for an emitter region E. The expression $f(x, E_x)$ represents the PDF in the X direction in the PICA image, where X is provided by the PICA image and the term $E_x$ is provided from the layout database 411. Likewise, the expression $f(y, E_y)$ represents the PDF in the Y direction in the PICA image, where Y is provided by the PICA image and the term $E_y$ is provided from the layout database 411. The time distortion model, the spatial distortion model in the X direction, and the spatial distortion model in the Y direction are each described using NHPP techniques and are therefore independent of each other. Due this independence, a form of likelihood estimation may be used to develop a closed form composite model where the time distortion model is "weighted" by the X and Y spatial distortion models.

In some embodiments, computational efficiencies may be obtained by realizing that over time, some X-Y coordinates do not change in photon intensity. For example, the data triplets (X,Y,T) may be parallelpipeds such that each of the recorded data vectors X, Y, and T may be different lengths because the photon emissions at a particular X-Y coordinate remain constant from one time interval to the next and may be represented once in a vector. In this manner, fewer mathematical calculations may be needed since vector lengths are shorter.

Figure 5:
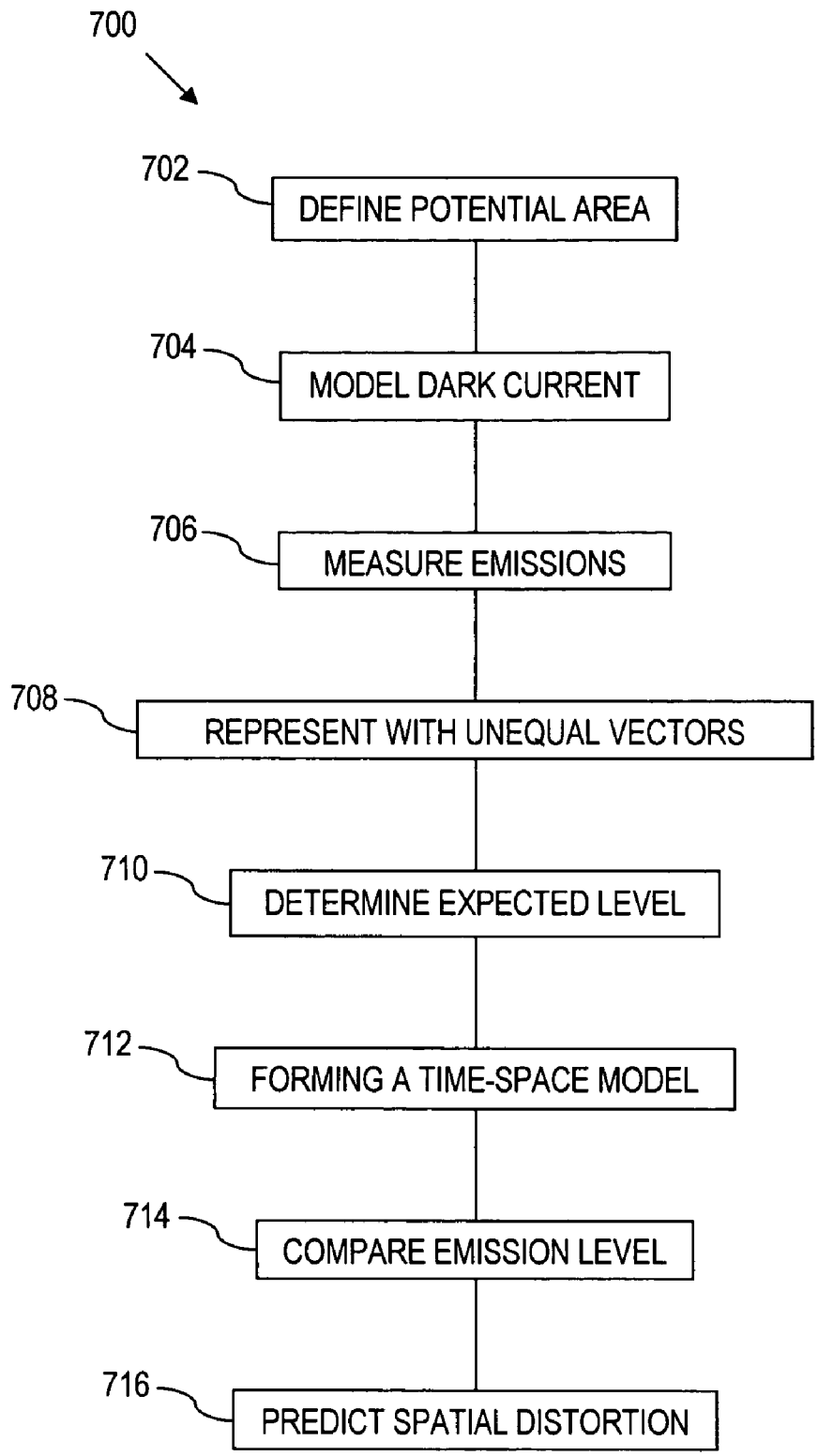
FIG. 5 shows a flow diagram for determining distortion in a circuit image.
Figure 6:
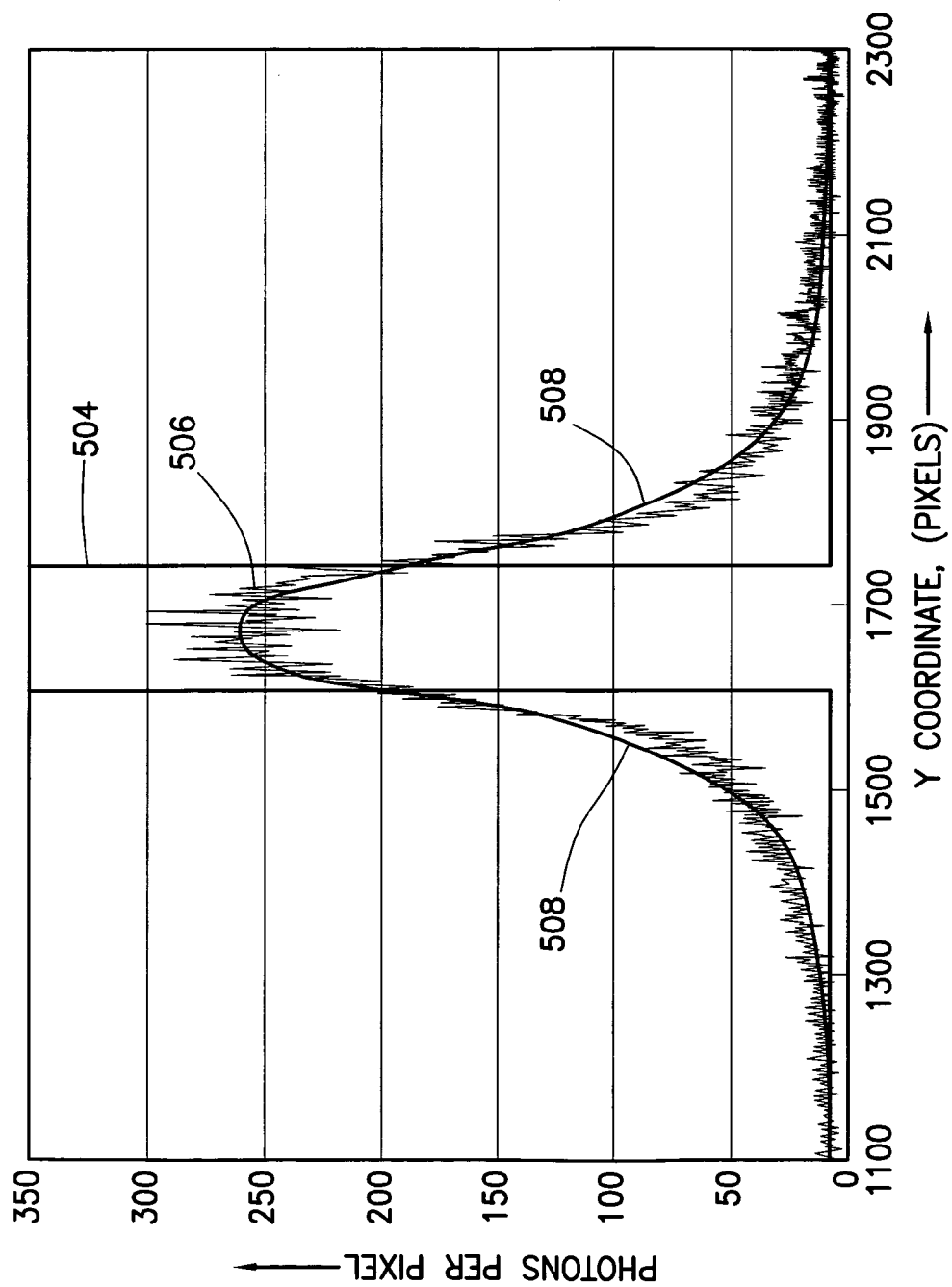
FIG. 6 shows an exploded view of FIG. 3.

FIG. 5 illustrates a flow diagram of an algorithm 700 for determining distortion in a circuit image such as the circuit image shown in FIG. 3. In block 702 a potential photon emission area is defined using the layout database 411. This block may include defining a potential photon emission area for each background phenomena in the circuit image. Block 704 includes modeling the dark current of the circuit image. Photon emissions are measured for a potential photon emission area in block 706. Per block 708, the measured photon emissions are represented with unequal vectors, which may reduce mathematical computations as described above. Block 710 includes determining the expected level of photon emissions over the potential photon emission areas defined by the layout database. In block 712, a composite time-space distortion model is formed by weighting a spatial-distortion model by a time-distortion model. In some embodiments, the time and space distortion models are mutually exclusive and may include evaluating Equation 2 shown above. In block 714, the expected photon emission level is compared with the measured photon emission level. Per block 716, the amount of spatial distortion is predicted for each potential photon emission area based on the results of comparing the expected and measured photon emission levels. This predicting may include implementing a PDF or mathematically convolving measured photon emission levels with a PDF.

Implications of the embodiments disclosed are numerous. For example, photon emissions relate to the switching of transistors and the PICA images may be used to determine if a transistor is not functioning properly. Because each successive generation of devices are smaller and smaller, transistors become more congested thereby increasing the difficultly in determining a transistor's functionality using PICA images. However, by reducing the timing and spatial distortion in PICA images, sharper PICA images may be produced, thereby increasing PICA's usefulness as device sizes shrink.

What is claimed is:

1. A method of determining distortion in a image of an integrated circuit, comprising:
    measuring photon emissions for a potential photon emission area within the integrated circuit;
    comparing an expected level of photon emission with the measured photon emissions;
    predicting an amount of distortion for the potential photon emission areas based on results of comparing the measured photon emissions to the expected photon emission level; and
    improving resolution of the image by approximating a photon intensity of adjacent spaced devices;
    wherein the potential photon emission area is defined using a layout database.

2. The method of claim 1, further comprising determining the expected level of photon emissions over the potential photon emission areas defined by the layout database.

3. The method of claim 1, further comprising implementing a probability density function (PDF) to predict the amount of distortion.

4. The method of claim 3, further comprising implementing a Laplace distribution as the PDF.

5. The method of claim 3, further comprising determining a cumulative distribution function (CDF) by convolving the expected level of photon emission with the PDF.

6. The method of claim 5, further comprising approximating the measured photon emissions using the CDF.

7. The method of claim 1, further comprising representing the measured photon emissions using vectors of unequal length to reduce mathematical computations.

8. The method of claim 1, wherein predicting the amount of distortion comprises using a Non-Homogenous Poisson Process (NHPP).

9. The method of claim 1, further comprising modeling background photon phenomena by defining a photon emission area for each phenomena.

10. The method of claim 9, further comprising modeling a dark current of the circuit image with coordinates of the defined photon emission area.

11. The method of claim 1, further comprising forming a composite time-spatial distortion model by weighting an amount of spatial distortion by a time distortion model.

12. The method of claim 11, wherein the spatial distortion and the time distortion model are mutually independent.

13. The method of claim 1, further comprising forgoing at least one of the acts of comparing, predicting, and improving if the measured photon emissions from the photon emission area are constant.

14. A method of determining distortion in a circuit image, comprising:
    measuring photon emissions for a potential photon emission area;
    comparing an expected level of photon emission with the measured photon emissions;
    predicting an amount of distortion for the potential photon emission areas based on results of comparing the measured photon emissions to the expected photon emission level; and
    forming a composite time-distortion model by weighting the amount of spatial distortion by a time distortion model
    wherein forming the composite time-spatial distortion model comprises evaluating:

$$\int_{-\infty}^{\infty} \lambda_E(t-s) \cdot \psi(s) ds \cdot f(x, E_x) \cdot f(y, E_y)$$

wherein the expression $\lambda_E(t-s)\psi(s)$ represents time distortion, $f(x, E_x)$ represents a probability density function (PDF) in the X direction of a circuit image, and $f(y, E_y)$ represents the PDF in the Y direction in the circuit image.

15. A method of determining distortion in a circuit image, comprising:
    measuring photon emissions for a potential photon emission area;
    comparing an expected level of photon emission with the measured photon emissions;
    predicting an amount of distortion for the potential photon emission areas based on results of comparing the measured photon emissions to the expected photon emission level; and
    improving resolution of the circuit image by approximating a photon intensity of adjacent spaced devices.

16. A system for determining distortion in an image of an integrated circuit, comprising:
    a storage module comprising a layout database of the integrated circuit that determines potential photon emission areas;
    a processing module coupled to the storage module and configured to determine an expected level of photon emissions over the potential photon emission areas; and
    an imaging photomultiplier coupled to the processing module and configured to measure photon emissions for the potential photon emission areas;
    wherein the processing module compares the expected level of photon emissions to the measured photon emissions and produces a mathematical model that predicts an amount of spatial distortion for each potential photon emission area;
    wherein the resolution of the image is improved by approximating a photon intensity of adjacent spaced devices within the integrated circuit.

17. The system of claim 16, wherein the processing module evaluates a probability density function (PDF) that approximates the amount of spatial distortion is contained in the circuit image.

18. The system of claim 17, wherein the PDF evaluated by the processing module is an exponential-power distribution.

19. The system of claim 18, wherein a cumulative distribution function (CDF) is determined by convolving the expected level of photon emission with the PDF.

20. The system of claim 17, wherein the processing module evaluates a composite time-spatial distortion model comprising a spatial distortion model and a time distortion model, wherein the spatial distortion model and the time distortion model are each described using NHPPs.

21. The system of claim 17, further comprising a photon emission area designated for each phenomenon in a circuit image, and wherein the photon emission area comprises background photon phenomena.

22. The system of claim 16, wherein the processing module adaptively represents the photon emissions with vectors of unequal length to reduce mathematical computations.

23. A system for determining distortion in an image of an integrated circuit, comprising:
 a storing means for determining potential photon emission areas from a layout database of the integrated circuit;
 a processing means for determining an expected level of photon emissions over the potential photon emission areas; and
 a comparing means for comparing the expected level of photon emissions to a measured level of photon emissions for the potential photon emission areas.

24. The system of claim 23, further comprising predicting means for predicting an amount of spatial distortion for each potential photon area.

* * * * *

UNITED STATES PATENT AND TRADEMARK OFFICE
CERTIFICATE OF CORRECTION

PATENT NO. : 7,057,182 B2 Page 1 of 1
APPLICATION NO. : 10/799170
DATED : June 6, 2006
INVENTOR(S) : John F. Kitchin It is certified that error appears in the above-identified patent and that said Letters Patent is hereby corrected as shown below:

In column 8, line 60, in Claim 16, delete "adiacent" and insert -- adjacent --, therefor.

Signed and Sealed this

Twenty-eighth Day of July, 2009

JOHN DOLL
*Acting Director of the United States Patent and Trademark Office*